(12) United States Patent
Elmiger et al.

(10) Patent No.: US 12,416,672 B2
(45) Date of Patent: Sep. 16, 2025

(54) DETECTING WELDED RELAY CONTACTS USING CONTACT CLOSE TIME MEASUREMENT

(71) Applicant: Rockwell Automation Technologies, Inc., Mayfield Heights, OH (US)

(72) Inventors: David Elmiger, Hitzkirch (CH); Kyle B. Adkins, Oak Creek, WI (US); Andrew E. Carlson, Franklin, WI (US); David M. Messersmith, Kenosha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 144 days.

(21) Appl. No.: 18/338,940

(22) Filed: Jun. 21, 2023

(65) Prior Publication Data

US 2024/0426914 A1 Dec. 26, 2024

(51) Int. Cl.
*G01R 31/327* (2006.01)
*H01H 47/00* (2006.01)

(52) U.S. Cl.
CPC ....... *G01R 31/3278* (2013.01); *H01H 47/002* (2013.01); *H01H 2300/052* (2013.01); *H01H 2300/054* (2013.01)

(58) Field of Classification Search
CPC ............. G01R 31/3278; H01H 1/0015; H01H 47/002; H01H 2047/003
See application file for complete search history.

(56) References Cited

U.S. PATENT DOCUMENTS

| 4,914,315 | A | 4/1990 | Nickolai |
| 8,901,934 | B2 | 12/2014 | Namou |
| 2008/0089000 | A1* | 4/2008 | Drake ................ G01R 31/3278 361/195 |
| 2015/0137819 | A1* | 5/2015 | Giordano ............. H01H 1/0015 324/418 |
| 2015/0346282 | A1* | 12/2015 | Jeon ................... G01R 31/3278 324/418 |

(Continued)

FOREIGN PATENT DOCUMENTS

| CN | 112041694 A | 12/2020 |
| CN | 110140056 B | 4/2021 |

(Continued)

OTHER PUBLICATIONS

Elmiger, et al; U.S. Appl. No. 17/660,711, filed Apr. 26, 2022.

*Primary Examiner* — Lee E Rodak
*Assistant Examiner* — Zannatul Ferdous

(57) ABSTRACT

A system includes a relay system and a controller. The relay system includes a plurality of relays. The controller is configured to transmit a close signal to a first relay and a second relay of the plurality of relays. The close signal is configured to close the first contact and the second contact of each of the first relay and the second relay. The controller is also configured to measure a first close time between the transmission of the close signal to the first relay and a time when the first relay closes, and to measure a second close time between the transmission of the close signal to the second relay and a time when the second relay closes. The controller is further configured to determine whether an electrical weld exists in the first relay or the second relay, based on the first and second close times.

20 Claims, 8 Drawing Sheets

(56) References Cited

U.S. PATENT DOCUMENTS

| | | | |
|---|---|---|---|
| 2016/0009189 A1 | 1/2016 | Yoshizawa | |
| 2017/0368951 A1 | 12/2017 | Adlhoch | |
| 2018/0158633 A1* | 6/2018 | Brandt | G01R 31/3278 |
| 2018/0315565 A1* | 11/2018 | Zhang | H01H 47/002 |
| 2023/0101428 A1 | 3/2023 | Adkins et al. | |
| 2023/0131949 A1 | 4/2023 | Kataoka | |
| 2023/0213582 A1 | 7/2023 | Buescher | |
| 2023/0343533 A1 | 10/2023 | Elmiger | |

FOREIGN PATENT DOCUMENTS

| | | |
|---|---|---|
| DE | 10160106 A1 | 6/2002 |
| DE | 102006054294 B4 | 4/2009 |
| JP | 5370553 B1 | 9/2013 |
| KR | 20140061637 A | 5/2014 |

\* cited by examiner

DETECTING WELDED RELAY CONTACTS USING CONTACT CLOSE TIME MEASUREMENT

RELATED APPLICATIONS

This application is related to co-pending U.S. application Ser. No. 18/338,870, entitled "DETECTING WELDED RELAY CONTACTS USING ELECTRICAL PULSE,", filed concurrently, which is hereby incorporated by reference in its entirety for all purposes.

This application is related to co-pending U.S. application Ser. No. 18/338,912, entitled "DETECTING WELDED RELAY CONTACTS USING MEASUREMENT AFTER CURRENT BREAK,", filed concurrently, which is hereby incorporated by reference in its entirety for all purposes.

This application is related to co-pending U.S. application Ser. No. 18/338,960, entitled "DETECTING WELDED RELAY CONTACTS USING SPANNER VOLTAGE MEASUREMENT,", filed concurrently, which is hereby incorporated by reference in its entirety for all purposes.

TECHNICAL BACKGROUND

In modern industrial environments relay systems are commonly used to control the supply of power to industrial equipment such as motors and the like. These relay systems commonly include a plurality of individual relays. For example, a relay system to control three-phase electrical power supplied to a piece of equipment typically includes one or more relay for each phase of the electrical power.

Over repeated operation of relay systems, materials within the contacts of the individual relays may segregate, resulting in increased concentrations of particular metal elements within small regions of the contacts. Eventually this segregation may result in metal migration such that a relay contact is welded shut.

In double break contact relays, where each relay includes two contacts, it is straightforward to determine when both contacts of the relay are shorted. However, in situations where only one of the contacts within the relay is welded detection of the weld is much more difficult.

SUMMARY

In an implementation, a system includes a relay system and a controller. The relay system includes a plurality of relays each having a first contact on an input side of the respective relay, the input side coupled to a power source, and a second contact on a load side of the respective relay is coupled to a load. The load sides of each of the respective relays are coupled through their respective loads.

The controller includes one or more processors and a memory. The memory having stored thereon instructions that, upon execution by the one or more processors, cause the one or more processors to perform a weld detection check.

The weld detection check includes transmitting a close signal to a first relay and a second relay of the plurality of relays. The close signal is configured to close the first contact and the second contact of each of the first relay and the second relay.

The weld detection check also includes measuring a first close time between the transmission of the close signal to the first relay and a time when the first relay closes, and measuring a second close time between the transmission of the close signal to the second relay and a time when the second relay closes. The weld detection check further includes determining whether an electrical weld exists in the first relay or the second relay, based on the first and second close times.

In another implementation, a method for detecting a welded relay contact by performing a weld detection check, includes closing a first relay and a second relay of a plurality of relays. Each relay of the plurality of relays includes a first contact on an input side of the respective relay and a second contact on a load side of the respective relay. The input side of each relay is coupled to a power source. The load side of each relay is coupled to a load, and the load sides of each of the respective relays are coupled through their respective loads.

The method also includes measuring a first close time between the transmission of the close signal to the first relay and a time when the first relay closes, and measuring a second close time between the transmission of the close signal to the second relay and a time when the second relay closes. The method further includes determining whether an electrical weld exists in the first relay or the second relay, based on the first and second close times.

In a further implementation, a system includes a relay system and a controller. The relay system includes a relay having a first contact on an input side of the relay, the input side coupled to a power source, and a second contact on a load side of the relay coupled to a load.

The controller includes one or more processors, and a memory having stored thereon instructions that, upon execution by the one or more processors, cause the one or more processors to perform a weld detection check.

The weld detection check includes transmitting a close signal to the relay, and measuring a close time between the transmission of the close signal to the relay and a time when the relay closes. The weld detection check also includes determining that an electrical weld exists in the relay when the close time is less than a threshold, where the threshold is less than a close time of a non-welded relay.

BRIEF DESCRIPTION OF THE DRAWINGS

Many aspects of the disclosure may be better understood with reference to the following drawings. While several implementations are described in connection with these drawings, the disclosure is not limited to the implementations disclosed herein. On the contrary, the intent is to cover all alternatives, modifications, and equivalents.

FIG. 3 illustrates an example relay system including a single weld.

FIG. 4 illustrates the example relay system of FIG. 3 after a second relay is closed.

FIG. 5 illustrates the example relay system of FIG. 4 as a close signal is transmitted to the first and third relays.

FIG. 6 illustrates the example relay system of FIG. 5 as current 610 is measured flowing through the first and second relays shortly after the close signal is transmitted to the first and third relays.

DETAILED DESCRIPTION

The following descriptions of various example embodiments and implementations of a system and method for the detection of welded relay contacts using electrical pulses. As discussed above, relay systems are commonly used in the control of industrial machines. In some example embodiments, relay systems are used within motor starter controllers. These devices are used to start industrial electrical motors powered by a multi-phase power source. Typically, these power sources have three phases of alternating current (AC) power with each phase offset from the others by 120° and require relay systems having three or more relays.

When a relay is shorted within such a controller, a reversing device will suffer a line-to-line short circuit of two phases of the power source internally if a relay on the reversing phases welds. This results in a catastrophic failure and the controller may be damaged or destroyed by the event. While this example embodiment, describes a motor starter controller, many other similar controllers and their associated industrial machines suffer similar failures if a weld is undetected and the relay shorts.

In this example embodiment, single welded double break relay contacts are detected by timing how long it takes each relay to close. When relays have a single welded contact, the gap of the other contact is substantially smaller than the normal gap of an open relay. Because the spanner has less distance to travel when the relay is closed, a relay having a single welded contact closes before a normal relay.

In other example embodiments, fully welded relays are also detected since they have a close time of zero and they are conducting current from the beginning of the measurement.

In some examples, the close time of each relay is measured, and when the close time of a relay is less than a threshold, the controller determines that relay has a weld. The threshold is based on the close time of a normal non-welded relay and may be a percentage or fraction of an average close time of a non-welded relay.

In other examples, two or more relays are closed at the same time, and the close time of each relay is measured. When one of the relays has a shorter close time than the other relays, that relay is determined to have a welded contact.

This solution for detecting single welded relays provides a technical advantage by detecting these failures before they cause short circuits within the controller. This early detection allows a user to replace the controller before a potentially destructive failure of the controller.

Figure 1:
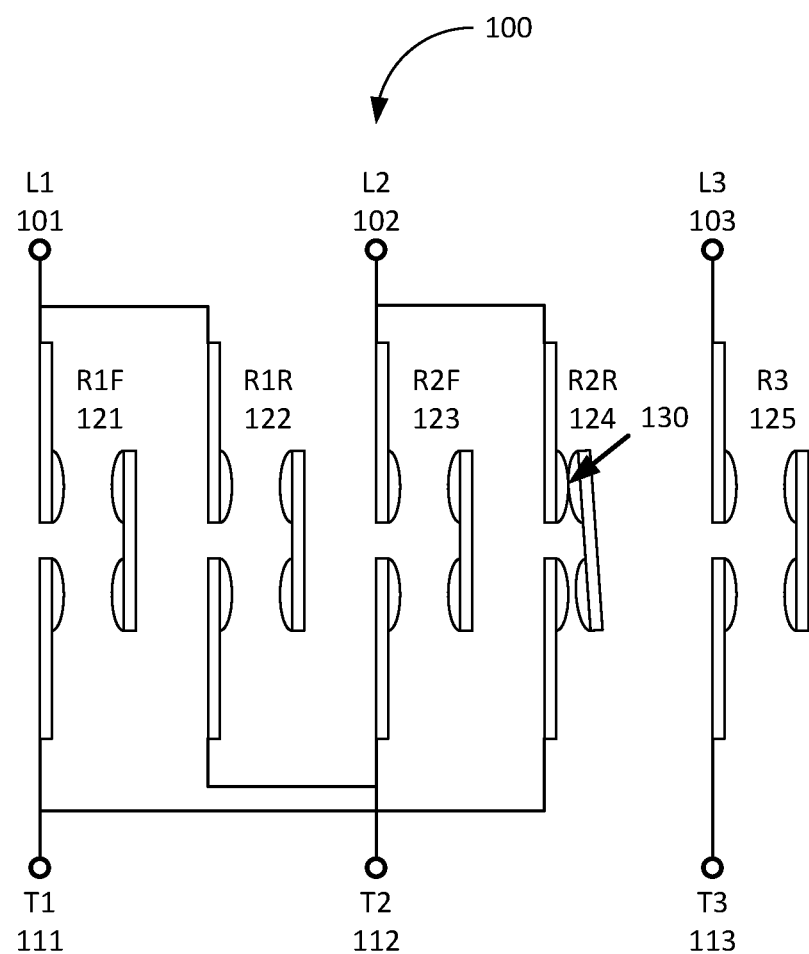
FIG. 1 illustrates an example relay system including a single weld.

FIG. 1 illustrates an example relay system 100 including a single weld 130. In this example embodiment, relay system 100 includes five relays: R1F 121, R1R 122, R2F 123, R2R 124, and R3 125. Relay system 100 includes three inputs: L1 101, L2 102, and L3 103, along with three outputs: T1 111, T2 112, and T3 113. When used in a motor starter controller, inputs L1 101, L2 102, and L3 103 are each coupled to a phase of a three-phase power source, and outputs T1 111, T2 112, and T3 113 are each coupled to a phase of an electric motor.

In this example, all of the relays: R1F 121, R1R 122, R2F 123, R2R 124, and R3 125 are off. However, relay R2R 124 has a first contact 130 which is welded shut.

Figure 2:
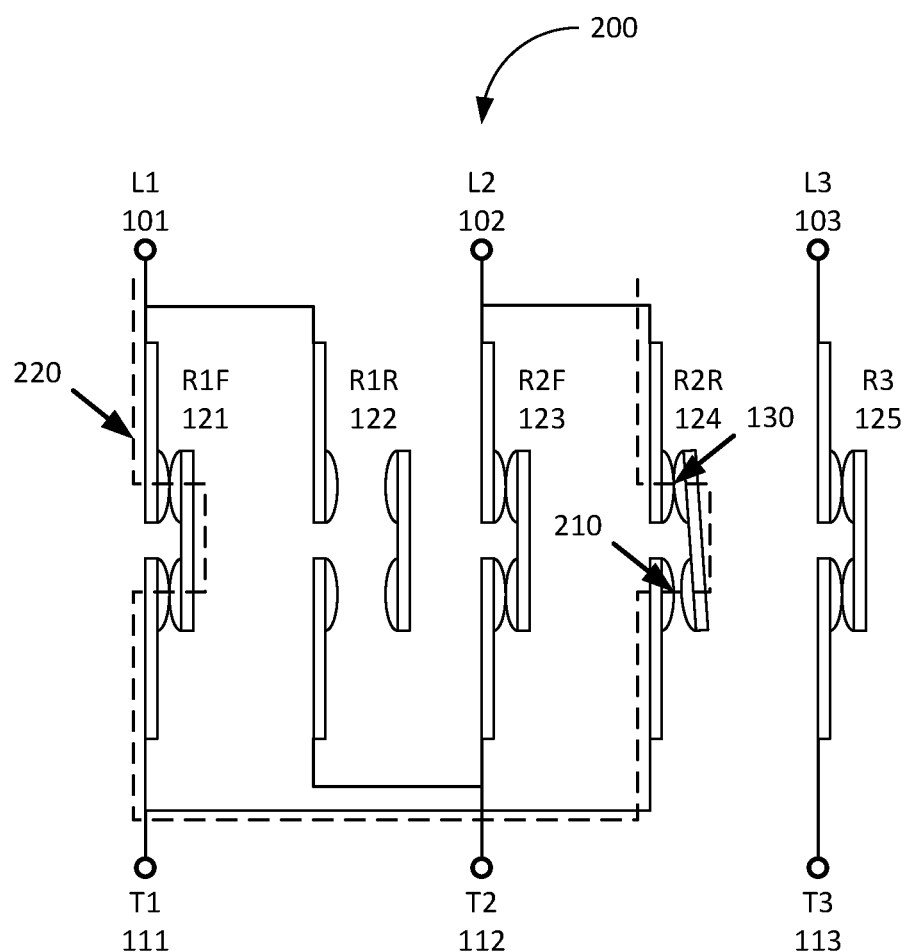
FIG. 2 illustrates the example relay system of FIG. 1 during operation where the single weld causes a short circuit.

FIG. 2 illustrates the example relay system 200 of FIG. 1 during operation where the single weld causes a short circuit. In this example embodiment, relays R1F 121, R2F 123, and R3 125 are all closed in order to drive the electric motor in a forward direction. Here, a first relay (R1F 121) is illustrated with a first contact 212 on an input side (L1 101) of the first relay, and a second contact 214 on a load side (T1 111) of the first relay.

A second relay (R2R 124) is also illustrated with a first contact 130 on an input side (L2 102) of the second relay, and a second contact 210 on a load side (T2 112) of the second relay. In this example, the first contact 130 of the second relay R2R 124 is welded.

Since the first contact 130 of the second relay R2R 124 is welded, the second contact 210 of the second relay R2R 124 has a much smaller than normal gap, and when voltage is applied, an arc may form across that gap and short the second relay R2R 124. This causes a short circuit between two phases of the input power source L1 101 and L2 102 as current flows through path 220. This short circuit may result in substantial damage to the power source and other equipment connected to relay system 200.

FIGS. 3-7 illustrate an example relay system during a series of steps performed during a method for detecting a welded relay contact by performing a weld detection check.

Figure 3:
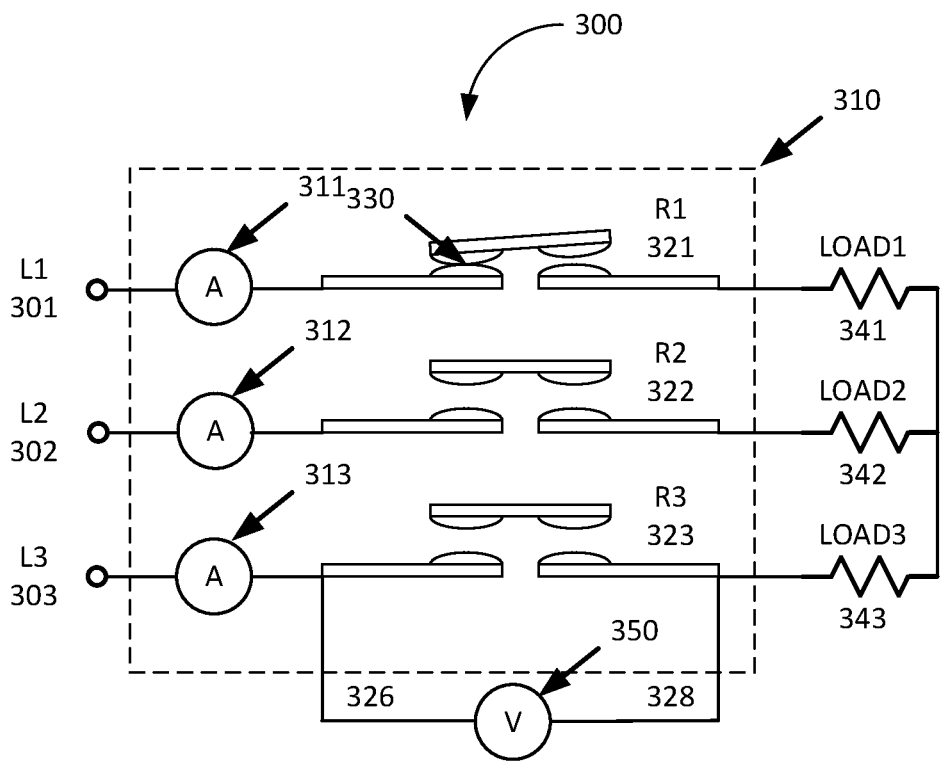
FIGS. 3-6 illustrate an example relay system during a series of steps performed during a method for detecting a welded relay contact by performing a weld detection check.

FIG. 3 illustrates an example relay system 310 including a single weld 330. In this example embodiment, a simple relay system 310 within industrial automation environment 300 is illustrated with three relays: R1 321, R2 322, and R3 323. In actual practice relay system 310 typically includes more relays, and the method illustrated in FIGS. 3-7 is performed sequentially on some or all of the relays within relay system 310.

In this example, relay system 310 includes three current sensors 311, 312, and 313. These current sensors utilize any of a wide variety of configurations and implementations while serving to detect welds. In this example embodiment, a voltage sensor 350 is illustrated coupled to a first contact 326 (input side) and a second contact 328 (load side) of relay R3 323. In some embodiments, additional voltage sensors are similarly coupled to relay R1 321 and R2 322, but are not illustrated here for clarity. These voltage sensors utilize any of a wide variety of configurations while serving to detect welds.

Here, relay system 310 includes three inputs L1 301, L2 302, and L3 303 coupled to three phases of a power source. The load sides of the relays within relay system 310 are connected to loads: LOAD1 341, LOAD2 342, and LOAD3 343 representing the loads within an industrial machine within industrial automation environment 300. The load side of each relay is coupled to a load, and the load side of each of the relays are coupled through their respective load. In this example, a first contact 330 of a first relay R1 321 is welded shut.

Figure 4:
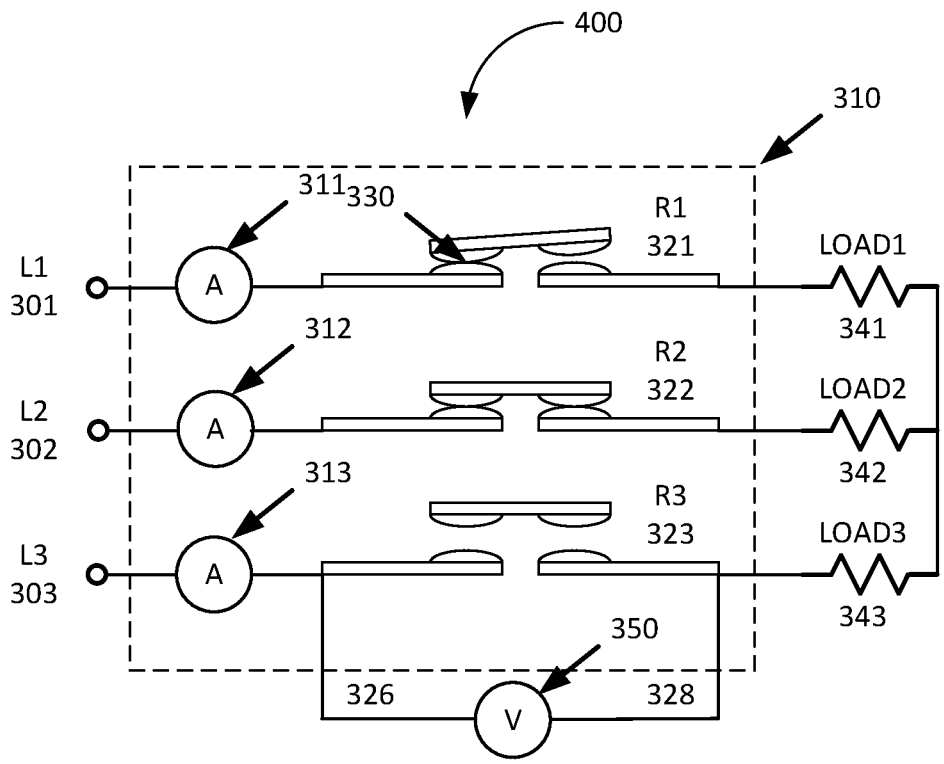

FIG. 4 illustrates the example relay system 310 of FIG. 3 within industrial automation environment 400 after second relay R2 322 is closed. In this example, second relay (R2 322) has a first contact on an input side of the second relay R2 322 that is coupled with power source L2 302 through current sensor 312 and a second contact on a load side of the second relay R2 322 is coupled with LOAD2 342. First relay R1 321 has a first contact 330 on an input side of the first relay R1 321 coupled with power source L1 301 through current sensor 311 and a second contact on a load side of the first relay R1 321 coupled with LOAD1 341.

Since the first contact 330 of the first relay R1 321 is welded shut, the second contact of the first relay R1 321 has a much smaller gap than a normally open contact would have. However, it still has a gap and stops current from flowing through the first relay R1 321.

Figure 5:
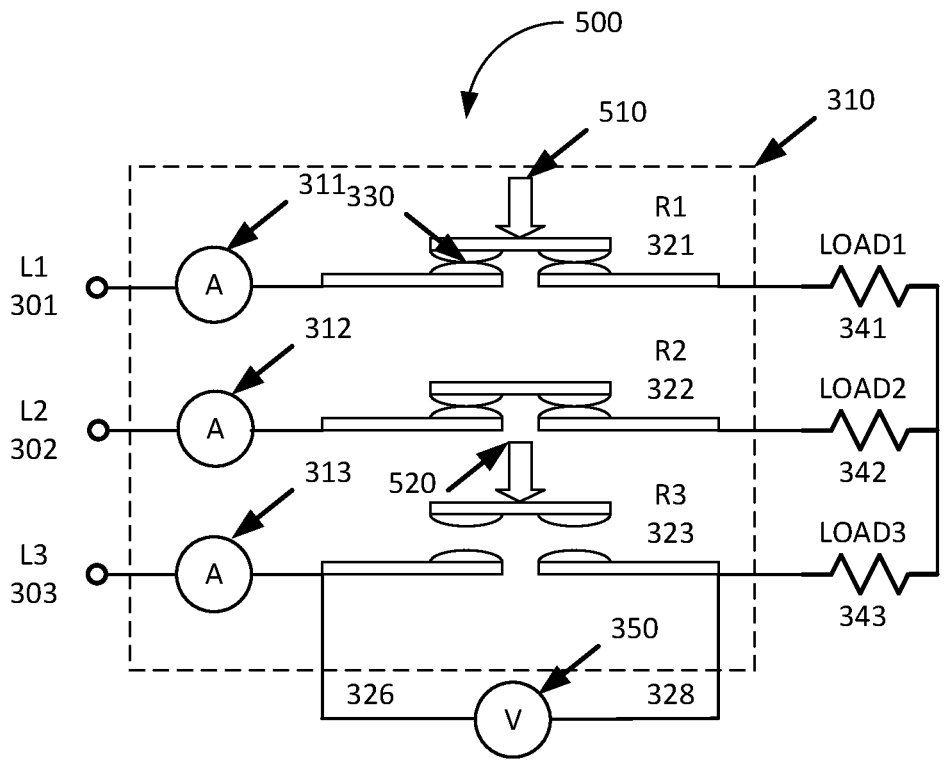

FIG. 5 illustrates the example relay system 310 of FIG. 4 within industrial automation environment 500 as a close signal 510 is transmitted to the first relay R1 321 and third relay R3 323. In this example embodiment, a close signal 510 is transmitted to an input (typically the coil input) of the first relay R1 321 and third relay R3 323 within relay system 310.

Figure 6:
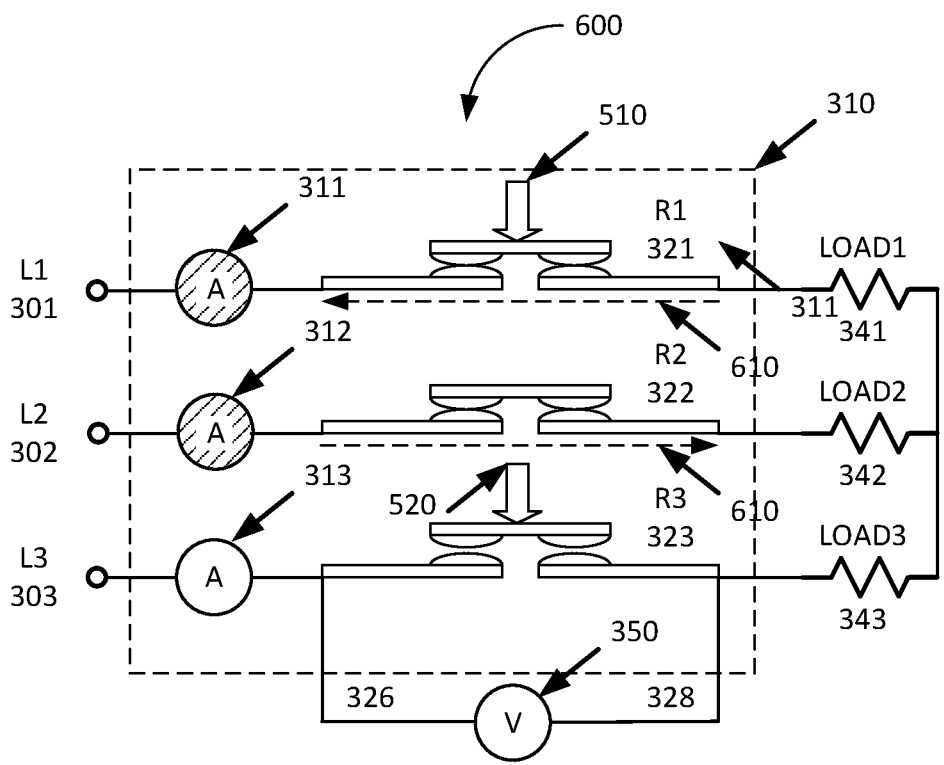

FIG. 6 illustrates the example relay system 310 of FIG. 5 within industrial automation environment 600 as current 610 is measured flowing through the first relay R1 321 and second relay R2 322 shortly after the close signal 510 is applied to the first relay R1 321 and third relay R3 323. Current sensors 311 and 312 detect current flowing through the first relay R1 321 and second relay R322 shortly after the close signal is transmitted to the first and third relays since the first relay R1 321 has a weld causing its gap to be shorter than normal so it closes before the third relay R3 323 closes.

Figure 7:
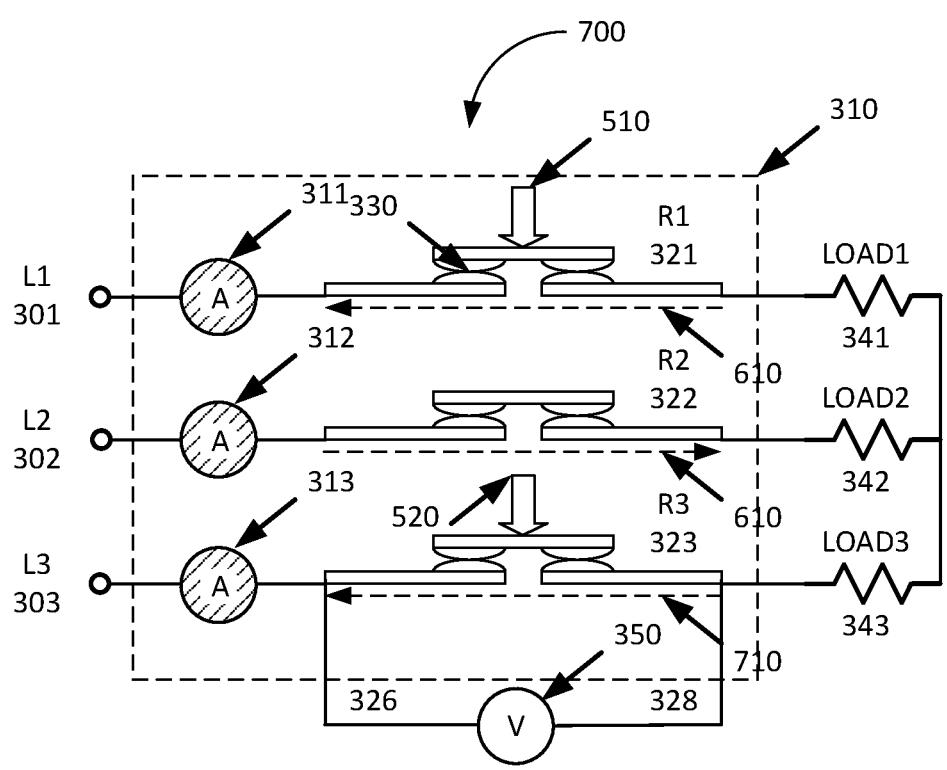
FIG. 7 illustrates the example relay system of FIG. 6 after the third relay closes.

FIG. 7 illustrates the example relay system 310 of FIG. 5 within industrial automation environment 700 after the third relay R3 323 closes. Since the third relay R3 323 does not have a weld, its gap between contacts is larger than that of the first relay R1 321 and it takes longer to close. After the third relay R3 323 has closed current 710 flows through the third relay R3 323, and current sensors 311, 312, and 313 all detect current flowing through each of the three relays. The outputs of these current sensors are used by the controller to measure close times for the first relay R1 321 and third relay R3 323.

In other example embodiments, voltage sensors such as voltage sensor 350 are used by the controller to measure close times for the first relay R1 321 and third relay R3 323. When the difference between these close times exceeds a threshold, a weld is indicated on the relay having the shorter close time.

In some example embodiments, the steps illustrated in FIGS. 3-7 are performed during system startup, and in some examples, these steps are performed a plurality of times to increase the probability of detecting any welds.

In response to detecting a weld, some example embodiments perform a system shutdown or disconnect the power source to prevent damage to the system and broadcast an alert message notifying users of the weld and the shutdown.

In other example embodiments, a single relay may be tested to determine if it has a welded contact. By measuring a close time of the relay and comparing the measured close time to the close time of non-welded relays, it may be determined if the relay has a weld. Since welded relays close quicker than non-welded relays if the close time of a relay is less than a threshold it indicates a weld. The threshold is based on typical close times of non-welded relays and may be a fraction or percentage of an average close time of similar non-welded relays. In some embodiments, the threshold is stored in firmware within the controller.

In further example embodiments, a third relay is closed before the first and second relays are closed in order to allow current to flow and be measured when the first and second relays are closed. In such an embodiment, the close time of the third relay is not measured, while the close times of the first and second relays are measured and compared to each other or to a threshold.

Figure 8:
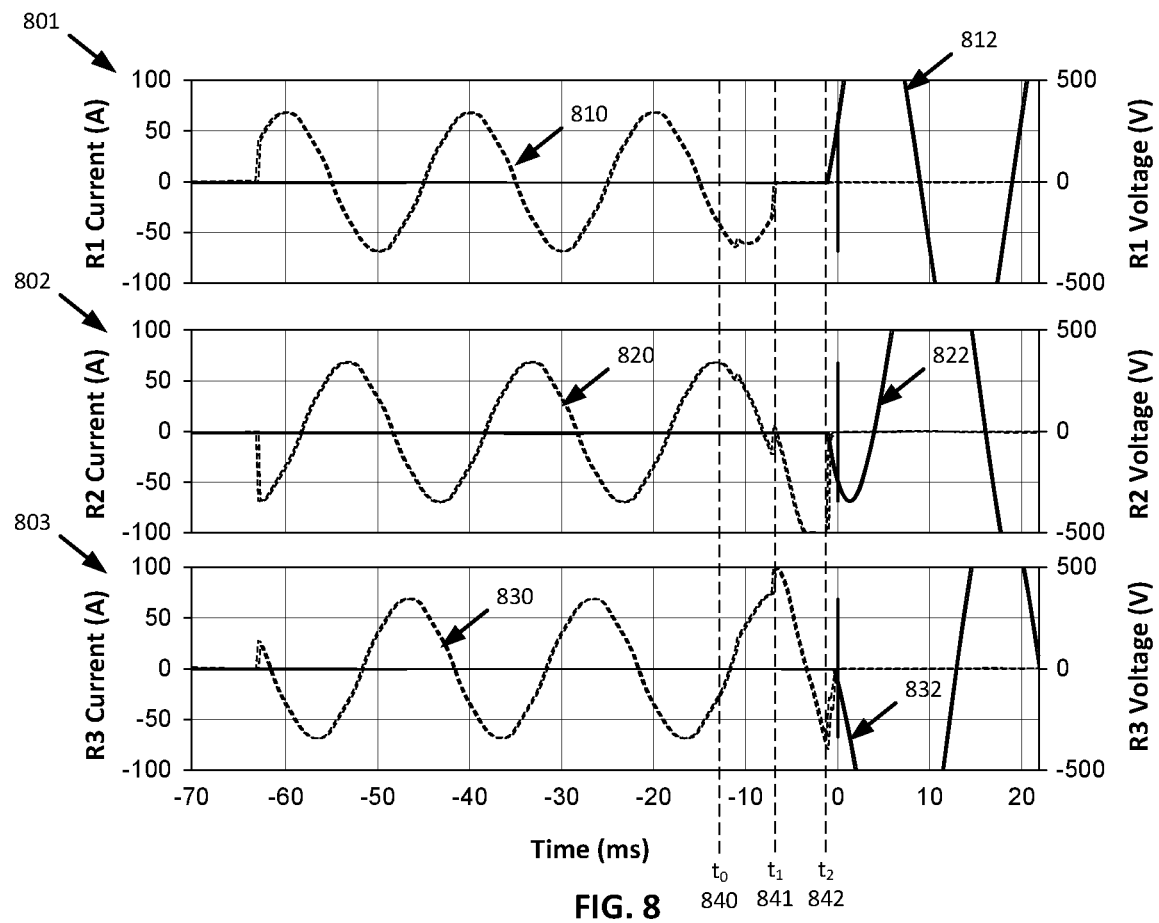
FIG. 8 illustrates simulated outputs of current sensors and voltage sensors for three relays during a close operation.

FIG. 8 illustrates simulated outputs of current sensors and voltage sensors for three relays during a close operation. In this example simulation, three graphs 801, 802, and 803 are provided, one for each of three relays, such as the three relays illustrated in FIGS. 3-7. In this example, graph 801 corresponds to first relay R1 321, graph 802 corresponds to second relay R2 322, and graph 803 corresponds to third relay R3 323

Each of the three left vertical axes represents current through the relay measured in amps, such as measured by current sensors 311, 312, and 313. Each of the three right vertical axes represents voltage across the relay measured in volts, such as measured by voltage sensor 350. The horizontal axis represents time measured in milliseconds.

Graph 801 illustrates an example output 810 of a voltage sensor coupled to first relay R1 321 and an example output 812 of current sensor 311. Graph 802 illustrates an example output 820 of a voltage sensor coupled to second relay R2 322 and an example output 822 of current sensor 312. Graph 803 illustrates an example output 830 of voltage sensor 350 coupled to third relay R3 323 and an example output 832 of current sensor 313.

At time $t_0$ 840 a close signal is transmitted to each of the three relays 321, 322, and 323. At time $t_1$ 841, the first relay R1 321 closes as indicated by voltage 810 going to zero and current 812 beginning to flow. At time $t_2$ 842, the second relay R2 322 and third relay R3 323 close as indicated by voltages 820 and 830 going to zero and currents 822 and 832 beginning to flow.

Close times for each of the relays are calculated from the outputs of the current or voltage sensors. First relay R1 321 has a close time of $(t_1-t_0)$. Second and third relays R2 322 and R3 323 have close times of $(t_2-t_0)$. Since the first relay R1 321 has a shorter close time that second relay R2 322 and third relay R3 323, the controller determines that the first relay R1 321 has a weld and responds appropriately.

Figure 9:
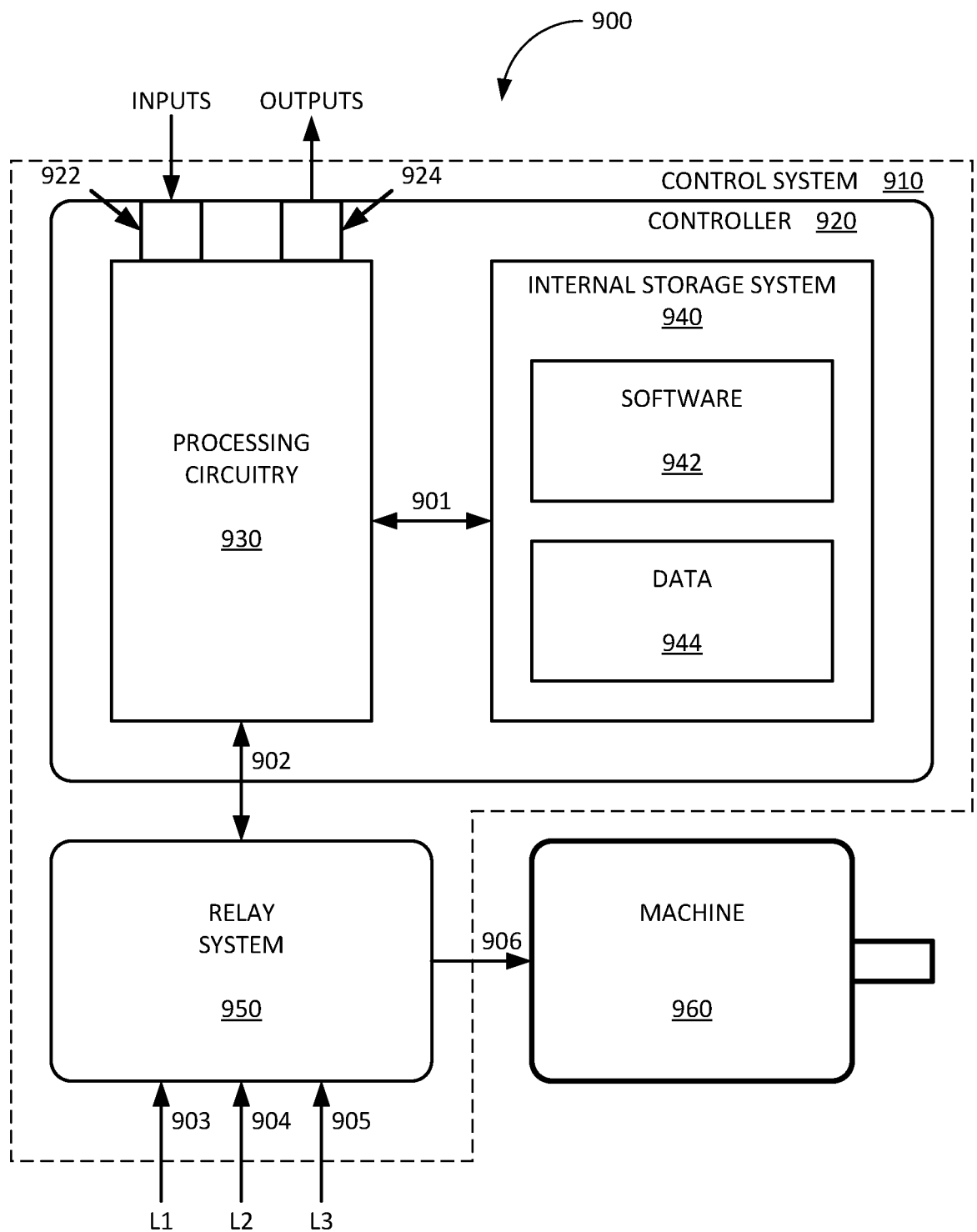
FIG. 9 illustrates an example block diagram of an industrial automation environment including a control system, configured to detect a welded relay contact, and an industrial machine.

FIG. 9 illustrates an example block diagram of an industrial automation environment 900 including a control system 910 configured to detect a welded relay contact, and an industrial machine 960. In this example embodiment, control system 910 includes controller 920 and relay system 950. Relay system 950 is similar to those illustrated in FIGS. 1-7 and described in detail above. In this example embodiment, relay system 950 receives three phases of power from a power source (not illustrated). Here, the three phases of power include L1 903, L2 904, and L3 905. Relay system 950 supplies power to machine 960 through link 906. In this example, link 906 includes at least three electrical conductors, each supplying a phase of power to machine 960. Relay system 950 receives commands from, and provides data to, controller 920 over link 902.

In this example embodiment, controller 920 includes processing circuitry 930, internal storage system 940, input port 922, and output port 924. Processing circuitry 930 is coupled with internal storage system 940 through link 901. Processing circuitry 930 is also coupled with relay system 950 through link 902.

Input port 922 is configured to receive control signals and data from external computing devices (not illustrated). Output port 924 is configured to provide control signals and data to external computing devices (not illustrated).

Processing circuitry 930 comprises electronic circuitry configured to direct control system 910 to control machine 960, and to detect a welded relay contact within relay system 950 by performing a weld detection check as described above. Processing circuitry 930 may comprise microprocessors and other circuitry that retrieves and executes software 942. Examples of processing circuitry 930 include general purpose central processing units, application specific processors, and logic devices, as well as any other type of processing device, combinations, or variations thereof. Processing circuitry 930 may be implemented within a single processing device but may also be distributed across multiple processing devices or sub-systems that cooperate in executing program instructions.

Internal storage system 940 may comprise any non-transitory computer readable storage media capable of storing software 942 that is executable by processing circuitry 930. Internal storage system 940 may also include various data structures 944 which comprise one or more registers, databases, tables, lists, or other data structures. Storage system 940 may include volatile and nonvolatile, removable and non-removable media implemented in any method or technology for storage of information, such as computer readable instructions, data structures, program circuits, or other data.

Storage system 940 may be implemented as a single storage device but may also be implemented across multiple storage devices or sub-systems co-located or distributed relative to each other. Storage system 940 may comprise additional elements, such as a controller, capable of communicating with processing circuitry 930. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which may be used to store the desired information and that may be accessed by an instruction execution system, as well as any combination or variation thereof.

Software 942 may be implemented in program instructions and among other functions may, when executed by controller 920 in general, or processing circuitry 930 in particular, direct controller 920, or processing circuitry 930, to operate as described herein to control machine 960, and to detect a welded relay contact within relay system 950 by performing a weld detection check. Software 942 may include additional processes, programs, or components, such as operating system software, database software, or application software. Software 942 may also comprise firmware or some other form of machine-readable processing instructions executable by elements of processing circuitry 930.

In general, software 942 may, when loaded into processing circuitry 930 and executed, transform processing circuitry 940 overall from a general-purpose computing system into a special-purpose computing system customized to operate as described herein for a controller 920 configured to control machine 960, and to detect a welded relay contact within relay system 950 by performing a weld detection check, among other operations. Encoding software 942 on internal storage system 940 may transform the physical structure of internal storage system 940. The specific transformation of the physical structure may depend on various factors in different implementations of this description. Examples of such factors may include, but are not limited to the technology used to implement the storage media of internal storage system 940 and whether the computer-storage media are characterized as primary or secondary storage.

For example, if the computer-storage media are implemented as semiconductor-based memory, software 942 may transform the physical state of the semiconductor memory when the program is encoded therein. For example, software 942 may transform the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate this discussion.

Figure 10:
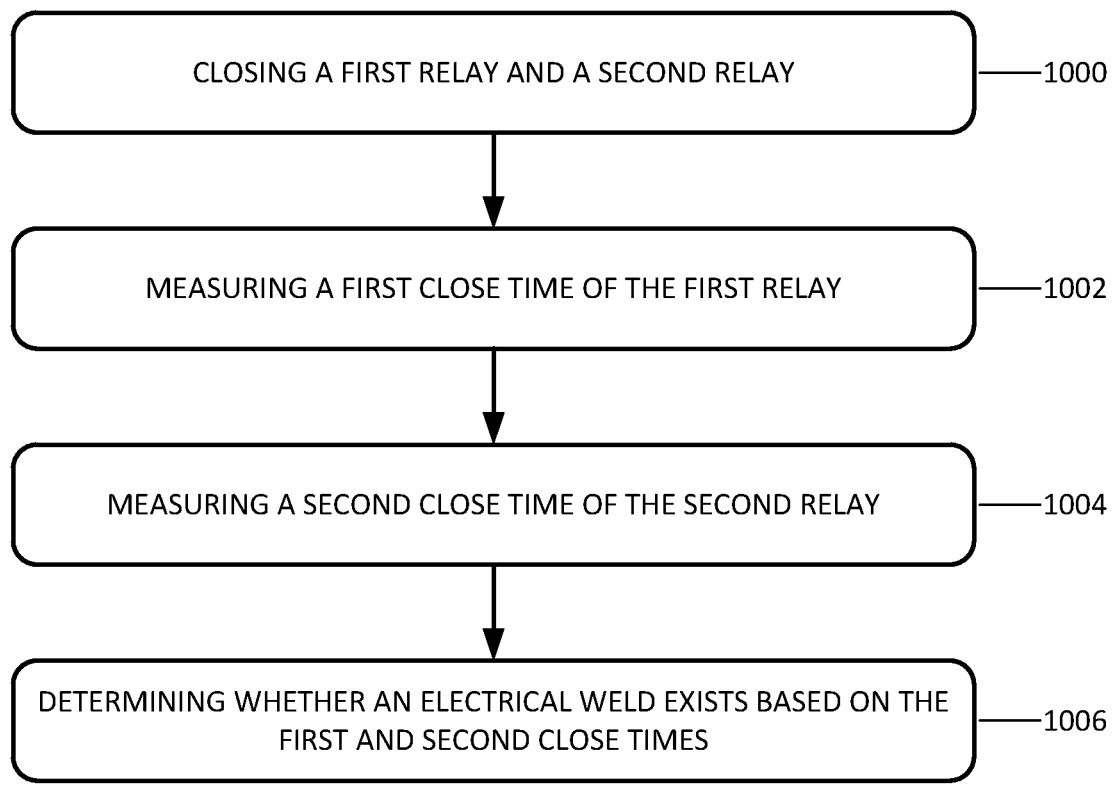
FIG. 10 illustrates a flowchart of an example method for detecting a welded relay contact by performing a weld detection check.

FIG. 10 illustrates a flowchart of an example method for detecting a welded relay contact by performing a weld detection check. In this example embodiment, controller 920 transmits a close signal to a first relay and a second relay of a plurality of relays within relay system 950, (operation 1000). Each relay of the plurality of relays includes a first contact on an input side of the respective relay and a second contact on a load side of the respective relay. The input side of each relay is coupled to a power source. The load side of each relay is coupled to a load. The load sides of each of the respective relays are coupled through their respective loads. The close signal is configured to close the first contact and the second contact of each of the first relay and the second relay.

Controller 920 measures a first close time of the first relay, (operation 1002), and a second close time of the second relay, (operation 1004). Controller 920 determines whether a weld exists on one of the relays based on the first and second close times, (operation 1006). As discussed above, relays having shorter than normal close times are likely to have a weld and upon determining that a relay has a weld, controller 920 responds accordingly.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as relays, unless otherwise stated, are generally representative of any one or more elements configured to operate as a relay or switch. Such relay components include relays, contactors, and similar components.

Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same terminals. For example, a resistor or capacitor shown and described herein as a single component may instead be multiple resistors or capacitors, respectively, coupled in series between the same two terminals as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system, comprising:
   a relay system, comprising a plurality of relays each having a first contact on an input side of the respective relay, the input side coupled to a power source, and a second contact on a load side of the respective relay coupled to a load, wherein the load sides of each of the respective relays are coupled through their respective loads; and
   a controller, comprising:
   one or more processors; and
   a memory having stored thereon instructions that, upon execution by the one or more processors, cause the one or more processors to perform a weld detection check comprising:
   transmit a close signal to a first relay and a second relay of the plurality of relays, wherein the close signal is configured to close the first contact and the second contact of each of the first relay and the second relay;
   measure a first close time between the transmission of the close signal to the first relay and a time when the first relay closes;
   measure a second close time between the transmission of the close signal to the second relay and a time when the second relay closes; and
   based on the first and second close times, determine whether an electrical weld exists in the first relay or the second relay.

2. The system of claim 1, wherein the time when the first relay closes and the time when the second relay closes are measured based on an output of a current sensor.

3. The system of claim 1, wherein the instructions comprise further instructions that, upon execution by the one or more processors, cause the one or more processors to:
   transmit a close signal to a third relay of the plurality of relays before transmitting a close signal to the first relay and the second relay.

4. The system of claim 1, wherein the instructions comprise further instructions that, upon execution by the one or more processors, cause the one or more processors to:
   calculate a difference between the first close time and the second close time; and
   based on the difference between the first close time and the second close time, determine whether an electrical weld exists in the first relay or the second relay.

5. The system of claim 4, wherein the instructions comprise further instructions that, upon execution by the one or more processors, cause the one or more processors to:
   determine that a weld exists in the first relay or the second relay when the difference between the first close time and the second close time exceeds a threshold.

6. The system of claim 5, wherein the instructions comprise further instructions that, upon execution by the one or more processors, cause the one or more processors to:
   determine that a weld exists in the first relay when the first close time is less than the second close time.

7. The system of claim 5, wherein the instructions comprise further instructions that, upon execution by the one or more processors, cause the one or more processors to:
   determine that a weld exists in the second relay when the second close time is less than the first close time.

8. The system of claim 1, wherein the instructions comprise further instructions that, upon execution by the one or more processors, cause the one or more processors to:
   perform the weld detection check on pairs of relays of the plurality of relays sequentially.

9. The system of claim 1, wherein the weld detection check is performed on startup of the system.

10. The system of claim 1, wherein the weld detection check is performed a plurality of times.

11. The system of claim 1, wherein the instructions comprise further instructions that, upon execution by the one or more processors, cause the one or more processors to:
    in response to detecting the electrical weld, disconnecting the power source to shut down the system.

12. The system of claim 1, wherein the system is an industrial automation motor starter.

13. A method for detecting a welded relay contact, the method comprising:
    performing a weld detection check, comprising:
    closing a first relay and a second relay of a plurality of relays, wherein each relay of the plurality of relays comprises a first contact on an input side of the respective relay and a second contact on a load side of the respective relay, wherein the input side of each relay is coupled to a power source, and the load side of each relay is coupled to a load, wherein the load sides of each of the respective relays are coupled through their respective loads;
    measuring a first close time between the transmission of the close signal to the first relay and a time when the first relay closes;
    measuring a second close time between the transmission of the close signal to the second relay and a time when the second relay closes; and
    based on the first and second close times, determining whether an electrical weld exists in the first relay or the second relay.

14. The method of claim 13, wherein the time when the first relay closes and the time when the second relay closes are measured based on an output of a current sensor.

15. The method of claim 13, further comprising:
transmitting a close signal to a third relay of the plurality of relays before transmitting a close signal to the first relay and the second relay.

16. The method of claim 13, further comprising:
calculating a difference between the first close time and the second close time; and
based on the difference between the first close time and the second close time, determining whether an electrical weld exists in the first relay or the second relay.

17. The method of claim 16, further comprising:
determining that a weld exists in the first relay or the second relay when the difference between the first close time and the second close time exceeds a threshold.

18. The method of claim 17, further comprising:
determining that a weld exists in the first relay when the first close time is less than the second close time.

19. The method of claim 17, further comprising:
determining that a weld exists in the second relay when the second close time is less than the first close time.

20. A system, comprising:
a relay system, comprising a relay having a first contact on an input side of the relay, the input side coupled to a power source, and a second contact on a load side of the relay coupled to a load; and
a controller, comprising:
one or more processors; and
a memory having stored thereon instructions that, upon execution by the one or more processors, cause the one or more processors to perform a weld detection check comprising:
transmit a close signal to the relay;
measure a close time between the transmission of the close signal to the relay and a time when the relay closes; and
determine that an electrical weld exists in the relay when the close time is less than a threshold, wherein the threshold is less than a close time of a non-welded relay.

\* \* \* \* \*